United States Patent
Kwak et al.

(10) Patent No.: US 10,388,842 B2
(45) Date of Patent: Aug. 20, 2019

(54) THERMOELECTRIC GENERATOR SYSTEM OF ENGINE

(71) Applicant: Hyundai Motor Company, Seoul (KR)

(72) Inventors: Jin Woo Kwak, Gyeongsangbuk-do (KR); In Woong Lyo, Gyeonggi-do (KR); Tae Won Lee, Incheon (KR); Hong Kil Baek, Seoul (KR); Han Saem Lee, Seoul (KR); Su Jung Noh, Seoul (KR); Seung Woo Lee, Seoul (KR); Kyong Hwa Song, Seoul (KR)

(73) Assignee: Hyundai Motor Company, Seoul (KR)

( * ) Notice: Subject to any disclaimer, the term of this patent is extended or adjusted under 35 U.S.C. 154(b) by 113 days.

(21) Appl. No.: 14/664,812

(22) Filed: Mar. 21, 2015

(65) Prior Publication Data

US 2016/0155920 A1 Jun. 2, 2016

(30) Foreign Application Priority Data

Nov. 27, 2014 (KR) .......................... 10-2014-0167587

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
CPC ... H01N 11/00; F01N 5/00; F01N 5/02; F01N 5/025; H01L 35/00; H01L 35/02;
(Continued)

(56) References Cited

U.S. PATENT DOCUMENTS 6,127,619 A * 10/2000 Xi ........................... H01L 35/16
                                                                                          136/201
7,150,147 B2    12/2006   Murata
(Continued)

FOREIGN PATENT DOCUMENTS

JP        H05287426 A    11/1993
JP        2000-328981 A    11/2000
(Continued)

OTHER PUBLICATIONS

"Stack." Merriam-Webster.com. Merriam-Webster, n.d. Web. Mar. 27, 2017.*
(Continued)

*Primary Examiner* — Edward J. Schmiedel
(74) *Attorney, Agent, or Firm* — Mintz Levin Cohn Ferris Glovsky and Popeo, P.C.; Peter F. Corless

(57) ABSTRACT

A thermoelectric generator system of an engine is provided and includes an insulating heat protective cover that is mounted within an engine. Additionally, a unit is disposed at an upper end of the heat protective cover to uniformly distribute heat energy to use the heat protective cover mounted at an upper end of an exhaust manifold of the engine to protect a wiring from exhaust heat. Accordingly, heat energy discarded from the exhaust manifold is absorbed to generate electricity using the waste heat discarded from the exhaust manifold without affecting the catalyst to improve the fuel efficiency of the internal combustion engine. Further, heat is transferred by conduction at a particular temperature or greater and heat is transferred by radiation and convection at a temperature less than the particular temperature to increase the efficiency.

11 Claims, 7 Drawing Sheets

(58) Field of Classification Search
CPC ......... H01L 35/28; H01L 35/30; H01L 35/32; F02B 65/00; F02B 73/00
See application file for complete search history.

(56) References Cited

U.S. PATENT DOCUMENTS

| | | |
|---|---|---|
| 9,145,812 B2 | 9/2015 | An et al. |
| 2005/0172992 A1* | 8/2005 | Shimoji ................. F01N 5/025 136/208 |
| 2006/0101822 A1 | 5/2006 | Murata |
| 2008/0042163 A1* | 2/2008 | Weaver, Jr. ............ F25B 21/00 257/108 |
| 2008/0314438 A1* | 12/2008 | Tran ...................... H01L 31/078 136/248 |
| 2009/0014053 A1* | 1/2009 | Schulz ..................... F21S 11/00 136/246 |
| 2012/0198841 A1 | 8/2012 | Sloss |
| 2012/0204557 A1 | 8/2012 | Jebasinski et al. |
| 2012/0211044 A1 | 8/2012 | Kurihara et al. |
| 2014/0000670 A1 | 1/2014 | Oesterle et al. |
| 2014/0305140 A1 | 10/2014 | Hasegawa |

FOREIGN PATENT DOCUMENTS

| | | |
|---|---|---|
| JP | 2006-266211 A | 10/2006 |
| JP | 2008-19674 A | 1/2008 |
| JP | 2009-278830 A | 11/2009 |
| JP | 2012-174940 A | 9/2012 |
| JP | 2012-191043 A | 10/2012 |
| JP | 2012-215112 A | 11/2012 |
| JP | 2012-225280 A | 11/2012 |
| JP | 2014-103734 A | 6/2014 |
| KR | 10-2005-0091750 A | 9/2005 |
| KR | 10-0869322 B1 | 11/2008 |
| KR | 10-1138526 B1 | 4/2012 |
| KR | 10-2013-0066061 A | 6/2013 |
| WO | 2014-034179 A1 | 3/2014 |

OTHER PUBLICATIONS

Office Action dated Jan. 8, 2019 in Japanese Patent Application No. 2015-105145, 3 pages.

* cited by examiner

THERMOELECTRIC GENERATOR SYSTEM OF ENGINE

CROSS-REFERENCE TO RELATED APPLICATION

This application is based on and claims the benefit of priority to Korean Patent Application No. 10-2014-0167587, filed on Nov. 27, 2014 in the Korean Intellectual Property Office, the disclosure of which is incorporated herein in its entirety by reference.

TECHNICAL FIELD

The present disclosure relates to a thermoelectric generator system of an engine, and more particularly, to a thermoelectric generator system of an engine that improves fuel efficiency of an internal combustion engine by generating electricity using high temperature waste heat generated from the engine.

BACKGROUND

Generally, a thermoelectric generator technology for a vehicle is a technology that improves fuel efficiency by generating electricity using a thermoelectric element mounted within high temperature heat source parts of a vehicle such as an exhaust system and an engine part along with a cooling system to move electrons based on temperature gradient. The existing thermoelectric generator system for a vehicle performs thermoelectric generation by mounting a thermoelectric generator module within an exhaust pipe.

Meanwhile, a technology of mounting the thermoelectric generator module within a circular pipe of the exhaust pipe in a form in which the thermoelectric generator module wraps the exhaust pipe has been developed. However, when the thermoelectric generator module is mounted within the existing circular pipe in a form in which the thermoelectric generator module wraps the exhaust pipe, there is a limitation of using highest temperature waste heat generated from the engine part and the planar thermoelectric generator module may not be easily mounted in the curved circular pipe. In addition, when a temperature region of the exhaust pipe is defined, only thermoelectric generator module meeting the temperature region may be used and therefore there is a limitation of power improvement.

SUMMARY

The present disclosure provides a thermoelectric generator system of an engine that improves fuel efficiency of an internal combustion engine by generating electricity using high temperature waste heat generated from the engine.

According to an exemplary embodiment of the present disclosure, a thermoelectric generator system of an engine may include: an insulating heat protective cover mounted within an engine; and a unit disposed at an upper end of the heat protective cover to uniformly distribute heat energy.

In particular, the unit may include: a heat spreader that may be disposed at a lower portion and include a hot heat spreader and a cold heat spreader; a thermoelectric generator module disposed at an upper portion of the heat spreader to perform thermoelectric generation; and a cooling jacket disposed at an upper portion of the thermoelectric generator module to perform cooling.

The heat protective cover may include a graphite sheet provided on a flat aluminum surface to conduct heat and absorb radiant heat. The unit may be configured by sequentially stacking the hot heat spreader, the graphite sheet, the thermoelectric generator module, the graphite sheet, the cold heat spreader, and the cooling jacket. The cooling jacket may be inserted with a U-type water cooling pipe.

Further, the heat protective cover may be fitted in an exhaust manifold of the engine, and the upper end of the heat protective cover may include the unit to transfer heat energy by the conduction at a specific temperature or greater and transfer heat energy by the radiation or the convection at a temperature lower than the specific temperature. The heat protective cover may include a bypass apparatus configured to drive a generator system using heat energy radiated from the heat protective cover during initial starting to generate electricity and improve thermoelectric power by conduction.

The bypass apparatus may include: a high heat conductive pillar having an internal structure configured of a heat pipe and to be movable; a cooling water disposed over the pillar; and a container configured to vertically move the pillar using high-pressure steam. The container may include: a first chamber in which condense water is accommodated; and a second chamber configured to be interlocked to the first chamber and have the pillar inserted thereinto. In the unit module, the thermoelectric generator module may be inserted between the hot heat spreader and the cold heat spreader which contact the pillar and the graphite sheet may be attached to each interface to minimize a heat transfer interface resistance.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Exemplary embodiments of the present disclosure will be described in detail with reference to the accompanying drawings. As illustrated in FIGS. 1 to 7, a thermoelectric generator system of an engine according to an exemplary embodiment of the present disclosure may include a heat protective cover 100 mounted within an engine 10 and a unit 200 mounted at the heat protective cover 100.

Figure 6:
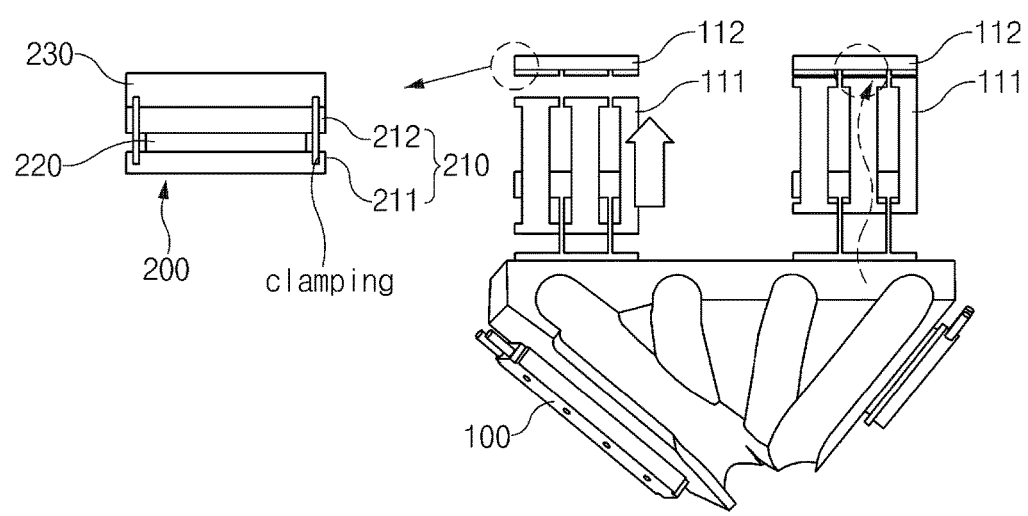
FIGS. 6 and 7 are exemplary diagrams illustrating a unit which is applied for the heat protective cover of the thermoelectric generator system of an engine according to the exemplary embodiment of the present disclosure.

As illustrated in FIGS. 1 and 2A-2C, the heat protective cover 100 may be an insulating member mounted to protect a wiring from substantially high temperature of an exhaust manifold to mount a thermoelectric generator module using waste heat from the engine 10 within an engine part. As illustrated in FIG. 6, the unit 200 may be mounted at an upper end of the heat protective cover 100 to uniformly distribute heat energy.

In this configuration, the unit 200 may include a heat spreader 210, a thermoelectric generator module 220, and a cooling jacket 230 and may be fastened with the heat protective cover 100 to operate a generator system. The heat spreader 210 may be mounted at a lower portion of the unit 200 and may include a hot heat spreader 211 and a cold heat spreader 212. In addition, the thermoelectric generator module 220 may be mounted at an upper portion of the heat spreader 210 to perform thermoelectric generation, and the cooling jacket 230 may be mounted over the thermoelectric generator module 220 to perform cooling.

Meanwhile, the related art uses a cover configured of a two-fold aluminum layer to trap air and to improve heat insulation performance but the heat protective cover 100 according to the exemplary embodiment of the present disclosure may have a graphite sheet provided on a flat aluminum surface to conduct heat and absorb radiant heat. In particular, the unit 200 may be configured by sequentially stacking the hot heat spreader 211, the graphite sheet, the thermoelectric generator module 220, the graphite sheet, the cold heat spreader 212, and the cooling jacket 230 at an upper portion of the heat protective cover 100. In particular, a U-type water cooling pipe may be inserted into the cooling jacket 230.

Furthermore, the graphite sheet may be inserted to minimize heat transfer resistance at an interface and absorb vibrations and the heat spreader 210 may be a thermoelectric element and a layer inserted to uniformly transfer heat to the thermoelectric element. In particular, the heat spreader 210 with the thermoelectric generator module 220 may be fastened together by being pressed by at least 200 psi to maximize heat transfer.

Further, according to the exemplary embodiment of the present disclosure, a size of a lower hot heat spreader 211 may be designed to be greater than that of the cold heat spreader 212 to prevent temperature from being non-uniformly distributed due to cooling around an edge of the thermoelectric generator module 220 and to assure a fastening part with the heat protective cover 100. A surface temperature of the heat protective cover 100 due to radiant heat from the exhaust manifold may be different based on operation conditions but generally may have a range from about 150 to 350° C. in an section of about 1500 to 4500 rpm.

Meanwhile, according to the exemplary embodiment of the present disclosure, the heat protective cover 100 may be fitted within the exhaust manifold of the engine 10. The upper end of the heat protective cover 100 may be mounted with the unit 200 to transfer heat energy by the conduction at a particular temperature or greater and transfer heat energy by the radiation or the convection at a temperature less than the particular temperature.

Figure 1:
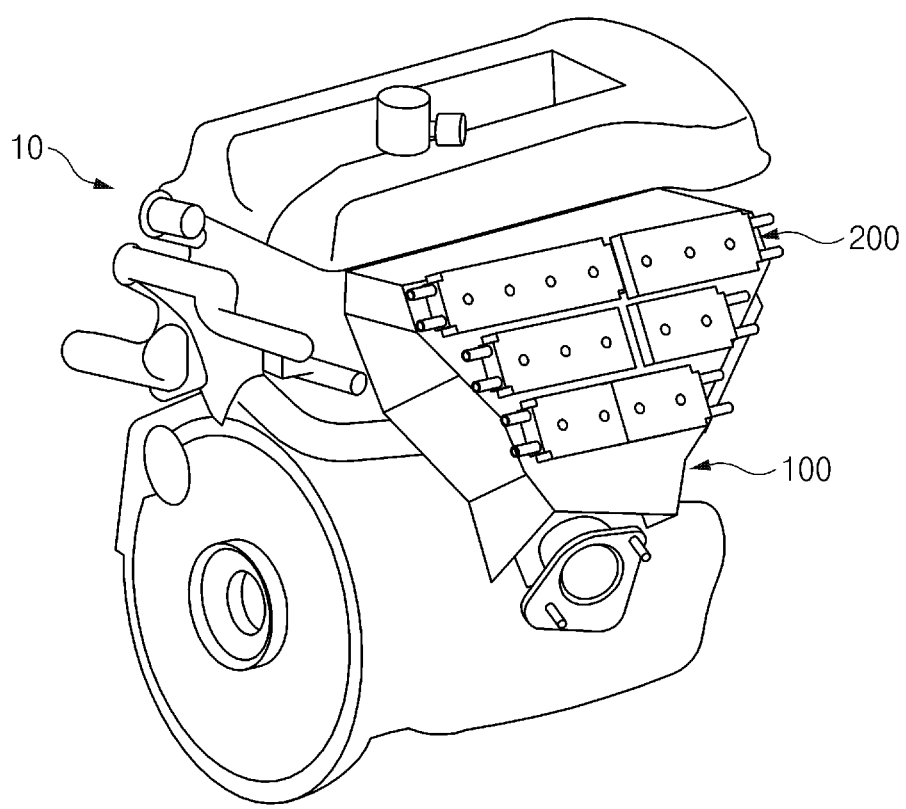
FIG. 1 is an exemplary diagram illustrating a thermoelectric generator system of an engine according to an exemplary embodiment of the present disclosure.
Figure 2A:
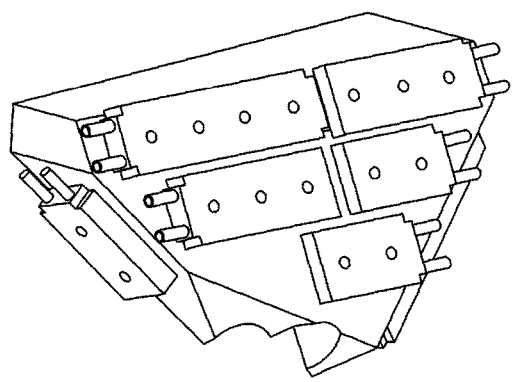
FIGS. 2A-2C are exemplary diagrams illustrating a heat protective cover of the thermoelectric generator system of an engine according to the exemplary embodiment of the present disclosure.
Figure 2B:
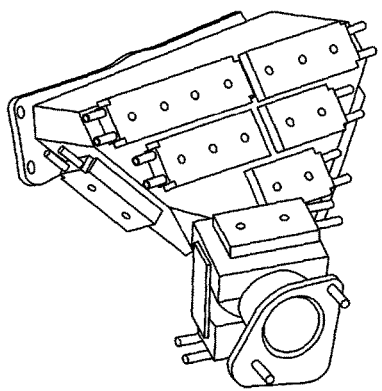
Figure 2C:
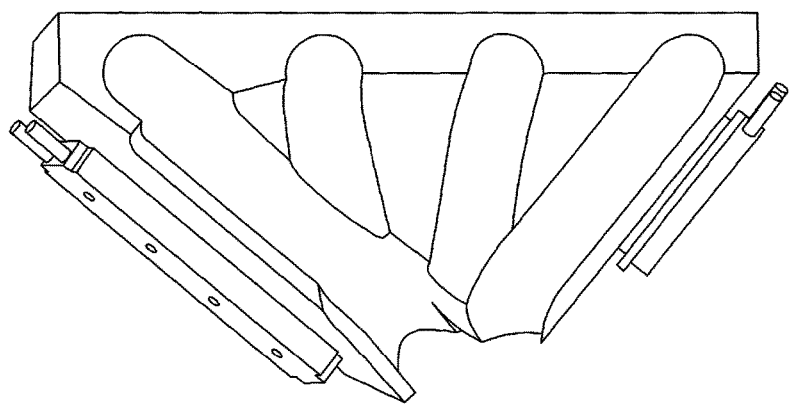

According to the exemplary embodiment of the present disclosure, as illustrated in FIG. 1, the heat protective cover 100 and the unit 200 may be mounted within the engine 10 to use the heat energy radiated from the exhaust manifold. In particular, as illustrated in FIG. 2A-C, the heat protective cover 100 which may be configured to transfer heat energy by conduction to perform the thermoelectric generation may have a clamping structure in which focusing parts of an upper end and a lower end are separated from each other.

Moreover, since the exhaust gas generated from the engine 10 has a substantial effect on a catalyst activation temperature, heat should be prevented from moving to the thermoelectric generator system for about 1870 seconds (based on HP mode, phase I) required to generate initial radiation after the engine starts and a temperature of exhaust gas at an inlet of a catalytic stage should be maintained at about 450° C. or greater since the catalyst is initially activated and then the catalyst is oxidized to generate heat. Further, according to the exemplary embodiment of the present disclosure, the heat protective cover 100 may include a bypass apparatus 110 configured to drive a generator system using heat energy radiated from the heat protective cover 100 during the initial starting to generate electricity and improve thermoelectric power by conduction.

Figure 3A:
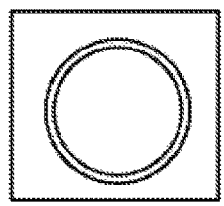
FIGS. 3A-3B exemplary diagrams illustrating a pillar of a bypass apparatus of the thermoelectric generator system of an engine according to the exemplary embodiment of the present disclosure.
Figure 3B:
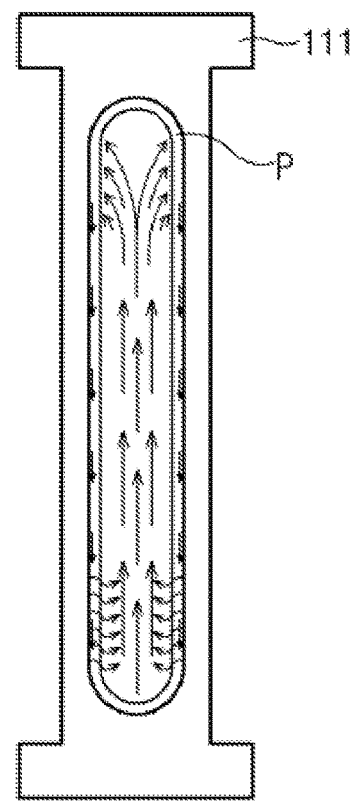
Figure 4:
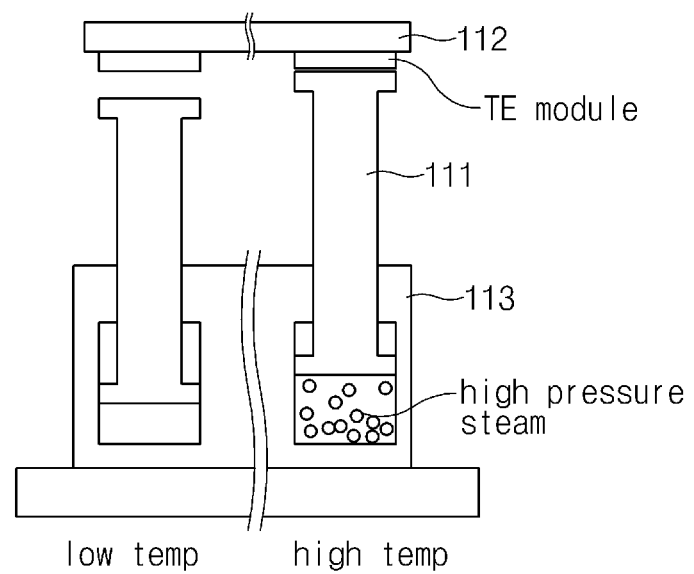
FIG. 4 is an exemplary front view illustrating the bypass apparatus of the heat protective cover of the thermoelectric generator system of an engine according to the exemplary embodiment of the present disclosure.
Figure 5:
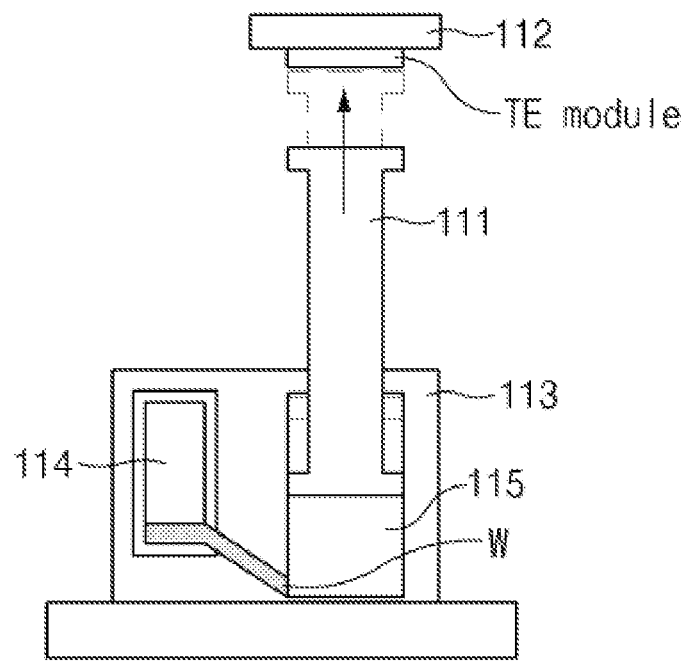
FIG. 5 is an exemplary side view illustrating the bypass apparatus of the heat protective cover of the thermoelectric generator system of an engine according to the exemplary embodiment of the present disclosure.

As illustrated in FIGS. 3A-B to 5, the bypass apparatus 110 may include a high heat conductive pillar 111 having an internal structure configured of a heat pipe P, a cooling water 112 mounted over the pillar 111, and a container 113 configured to vertically move the pillar 111 using high-pressure steam. In this configuration, the container 113 may include a first chamber 114 in which condense water w may be accommodated and a second chamber 115 interlocked to the first chamber 114 and into which the pillar 111 may be inserted.

Further, the container 113 may be made of high heat conductive metals such as aluminum and copper and an upper end and a lower end thereof may be formed in a substantially square shape to secure a heat contact area. In particular, the upper end of the container 113 may be maintained to have an area greater than that of a TE module to be contacted during the movement of the pillar 111 to uniformly supply heat energy over the entire area of the module.

Meanwhile, reviewing an order of the thermoelectric generation according to the exemplary embodiment of the present disclosure, the thermoelectric generation may be generated by moving heat energy from the exhaust manifold of the engine 10 to the heat protective cover 100 by the conduction and radiating heat energy from a section of the upper end of the heat pipe P under the low temperature environment (e.g., less than a particular temperature) and the thermoelectric generation may be generated by forming high pressure steam at the boiling point (B.P.) or greater of a fluid in a lower container 113 under the high temperature environment and contacting a hot side of the thermoelectric generator module 220 by a pressure while supplying heat energy to the pillar 111.

Further, the pillar 111 may be inserted with the heat pipe P to have high conductivity (about ~5000 W/mK), the heat energy may move at a rapid response speed, substantially high temperature and high pressure steam may increase to a predetermined height as illustrated in FIG. 5 and then may move to the first chamber 114 formed with a wall surface of a heat insulation material through a passage formed on a wall surface of the lower end of the pillar 111 and may be condensed therein, and the condensed fluid may move again to the lower container 113 through a channel formed under the first chamber 114. In particular, a flow rate of the fluid requires a water level at which a high pressure may be maintained even at substantially low temperature and a separate clamping may be provided to increase surface sticking between the pillar 111 and the module (or hot spreader).

Figure 7:
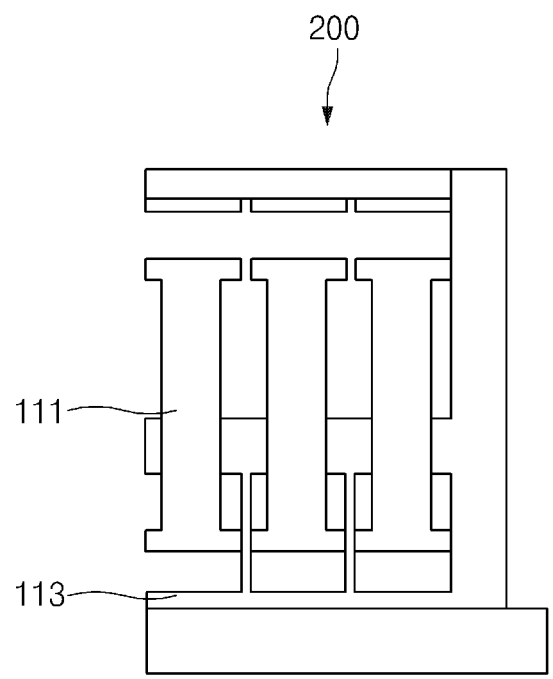

Moreover, in the unit module, the thermoelectric generator module 220 may be inserted between the hot heat spreader 211 and the cold heat spreader 212 which contact the pillar 111 and the graphite sheet may be attached to each interface, thereby minimizing a heat transfer interface resistance. As illustrated in FIGS. 6 and 7, the unit 200 in which the cooling jacket 230 is attached to the cold heat spreader 212 may be configured to maintain a particularly spaced distance from the bypass apparatus 110 and then may be attached to the heat protective cover 100. Particularly, as the fluid used in the container 113, water may be used but other fluids may also be applied in consideration of a conducted heat value and durability of the module.

Accordingly, according to the exemplary embodiment of the present disclosure, the thermoelectric generator system may include the insulating heat protective cover 100 mounted within the engine 10 and the unit 200 disposed at the upper end of the heat protective cover 100 to uniformly distribute the heat energy to use the heat protective cover 100 mounted at the upper end of the exhaust manifold of the engine 10 to protect the wiring from the exhaust heat, thereby absorbing heat energy discarded from the exhaust manifold to generate electricity, using the waste heat discarded from the exhaust manifold without affecting the catalyst to improve the fuel efficiency of the internal combustion engine, and transferring heat by conduction at a particular temperature or greater and transferring heat by radiation and convection at temperature less than the particular temperature to increase the efficiency.

As described above, although the present disclosure has been described with reference to exemplary embodiments and the accompanying drawings, it would be appreciated by those skilled in the art that the present disclosure is not limited thereto but various modifications and alterations might be made without departing from the scope defined in the following claims.

What is claimed is:

1. A thermoelectric generator system of an engine, comprising:
a heat protective cover mounted within the engine, the heat protective cover being an insulating member to protect a wiring from exhaust heat; and
a unit disposed on the heat protective cover to uniformly distribute heat energy,
wherein the unit includes:
a hot side heat spreader;
a thermoelectric generator module disposed on top of the hot side heat spreader to perform thermoelectric generation;
a cold side heat spreader disposed on top of the thermoelectric generator module; and
a cooling jacket disposed on top of the thermoelectric generator module to perform cooling,
wherein the heat protective cover includes a graphite sheet disposed on a flat aluminum surface to conduct heat and absorb radiant heat,
wherein the unit is configured by sequentially stacking the hot side heat spreader, the thermoelectric generator module, the cold side heat spreader, and the cooling jacket,
wherein the heat protective cover includes a bypass apparatus having a heat conductive pillar, the heat conductive pillar has an internal structure having a heat pipe, a cooling water disposed over the heat conductive pillar, and a container, and
wherein the heat conductive pillar is vertically moved by forming steam at a boiling point in the container, thereby enabling the heat conductive pillar to directly contact the hot side heat spreader.

2. The thermoelectric generator system of an engine according to claim 1, wherein a U-shaped water cooling pipe is inserted into the cooling jacket.

3. The thermoelectric generator system of an engine according to claim 1, wherein the heat protective cover is fitted within an exhaust manifold of the engine, and an upper end of the heat protective cover includes the unit to transfer heat energy by conduction at a particular temperature or greater and transfer heat energy by radiation or convection at a temperature less than the particular temperature.

4. The thermoelectric generator system of an engine according to claim 3, wherein the bypass apparatus is configured to drive a generator system using heat energy radiated from the heat protective cover to generate electricity and improve thermoelectric power by the conduction.

5. The thermoelectric generator system of an engine according to claim 1, wherein the container includes:
a first chamber in which condense water is accommodated; and
a second chamber interlocked to the first chamber and into which the heat conductive pillar is inserted.

6. The thermoelectric generator system of an engine according to claim 1, wherein the cooling jacket is disposed on top of the cold side heat spreader.

7. A thermoelectric generator system of an engine, comprising:

a heat protective cover mounted within the engine, the heat protective cover being an insulating member to protect a wiring from exhaust heat; and a unit disposed on the heat protective cover to uniformly distribute heat energy, wherein the unit includes:
- a hot side heat spreader;
- a thermoelectric generator module disposed on top of the hot side heat spreader to perform thermoelectric generation;
- a cold side heat spreader disposed on top of the thermoelectric generator module; and
- a cooling jacket disposed on top of the cold side heat spreader to perform cooling, wherein the heat protective cover includes a graphite sheet disposed on a flat aluminum surface to conduct heat and absorb radiant heat, wherein the unit is configured by sequentially stacking the hot side heat spreader, the thermoelectric generator module, the cold side heat spreader, and the cooling jacket, wherein the heat protective cover includes a bypass apparatus having a heat conductive pillar, the heat conductive pillar has an internal structure having a heat pipe, a cooling water disposed over the heat conductive pillar, and a container, and wherein the heat conductive pillar is vertically moved by forming steam at a boiling point in the container, thereby enabling the heat conductive pillar to directly contact the hot side heat spreader.

8. The thermoelectric generator system of an engine according to claim 7, wherein a U-shaped water cooling pipe is inserted into the cooling jacket.

9. The thermoelectric generator system of an engine according to claim 7, wherein the heat protective cover is fitted within an exhaust manifold of the engine, and an upper end of the heat protective cover includes the unit to transfer heat energy by conduction at a particular temperature or greater and transfer heat energy by radiation or convection at a temperature less than the particular temperature.

10. The thermoelectric generator system of an engine according to claim 9, wherein the bypass apparatus is configured to drive a generator system using heat energy radiated from the heat protective cover to generate electricity and improve thermoelectric power by the conduction.

11. The thermoelectric generator system of an engine according to claim 7, wherein the container includes:
- a first chamber in which condense water is accommodated; and
- a second chamber interlocked to the first chamber and into which the heat conductive pillar is inserted.

* * * * *